United States Patent
Huang

(10) Patent No.: US 7,443,228 B2
(45) Date of Patent: Oct. 28, 2008

(54) LEAKAGE CURRENT PREVENTION CIRCUIT

(75) Inventor: Yong-Zhao Huang, Shenzhen (CN)

(73) Assignees: Hong Fu Jin Precision Industry (Shen Zhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/560,855

(22) Filed: Nov. 17, 2006

(65) Prior Publication Data

US 2008/0074175 A1 Mar. 27, 2008

(30) Foreign Application Priority Data

Sep. 27, 2006 (CN) .................. 2006 1 0062821

(51) Int. Cl.
*H11C 5/14* (2006.01)
(52) U.S. Cl. .................... 327/530; 327/544
(58) Field of Classification Search ............. 327/530, 327/544
See application file for complete search history.

(56) References Cited

U.S. PATENT DOCUMENTS

| | | | | |
|---|---|---|---|---|
| 5,724,297 A | * | 3/1998 | Noda et al. | 365/226 |
| 6,249,174 B1 | * | 6/2001 | Tsunezawa | 327/538 |
| 6,331,719 B2 | * | 12/2001 | Ooishi | 257/207 |
| 6,373,328 B2 | * | 4/2002 | Rapp | 327/536 |
| 6,433,584 B1 | * | 8/2002 | Hatae | 326/80 |
| 6,853,574 B2 | | 2/2005 | Singhal | |
| 6,917,555 B2 | | 7/2005 | Bedwell et al. | |

\* cited by examiner

*Primary Examiner*—Kenneth B. Wells
(74) *Attorney, Agent, or Firm*—Wei Te Chung

(57) ABSTRACT

A leakage current prevention circuit for preventing a power source from being affected by leakage current includes a first transistor, and a second transistor. A gate of the first transistor receives a control signal and a source of the first transistor is grounded. A gate of the second transistor is connected to a drain of the first transistor, a drain of the second transistor is electrically connected to the power source, and a source of the second transistor is connected to a pull-up circuit which is connected to a chipset. When the chipset receives a drive signal, the control signal controls status of the first and second transistors so that the power source provides voltage to the pull-up circuit for the drive signal.

8 Claims, 3 Drawing Sheets

LEAKAGE CURRENT PREVENTION CIRCUIT

BACKGROUND OF THE INVENTION

1. Field of the Invention

The present invention relates to prevention circuits, and more specifically to a leakage current prevention circuit for preventing a power source from being affected by leakage current.

2. Description of Related Art

Generally speaking, nonconductors are materials that conduct little or no electricity. However, no absolute nonconductor exists. Leakage current is current that flows between two metallic components that are insulated or flows from an electrified component to ground via a peripheral medium or insulated surfaces thereof. Leakage current is an important consideration in the design of an electrical product.

There are two parts to leakage current: conduction current and displacement current. Conduction current flows through insulated resistors; and displacement current flows through distributive capacitances. Because distributive capacitance increases as the frequency of current in electrified components increases, overall leakage current increases as well. Referring to FIG. 1, in general, a drive signal from an external device 10 for a pull-up circuit 12 is used to drive a chipset 14 of an electronic circuit. To ensure success, a power source 16 is usually adapted to provide voltage for the drive signal of the pull-up circuit 12. However, leakage current is typically generated at the instant of connecting or disconnecting the external device 10 to or from the pull-up circuit 12. The stability of the power source 16 is adversely affected as the leakage current flows to the power source 16.

What is desired, therefore, is to provide a leakage current prevention circuit that prevents a power source from being affected by leakage current.

SUMMARY OF THE INVENTION

A leakage current prevention circuit for preventing a power source from being affected by leakage current includes a first transistor, and a second transistor. A gate of the first transistor receives a control signal and a source of the first transistor is grounded. A gate of the second transistor is connected to a drain of the first transistor, a drain of the second transistor is electrically connected to the power source, and a source of the second transistor is connected to a pull-up circuit which is connected to a chipset. When the chipset receives a drive signal, the control signal controls status of the first and second transistors so that the power source provides voltage to the pull-up circuit for the drive signal.

Other advantages and novel features will become more apparent from the following detailed description of preferred embodiments when taken in conjunction with the accompanying drawings, in which:

DETAILED DESCRIPTION OF THE INVENTION

Figure 1:
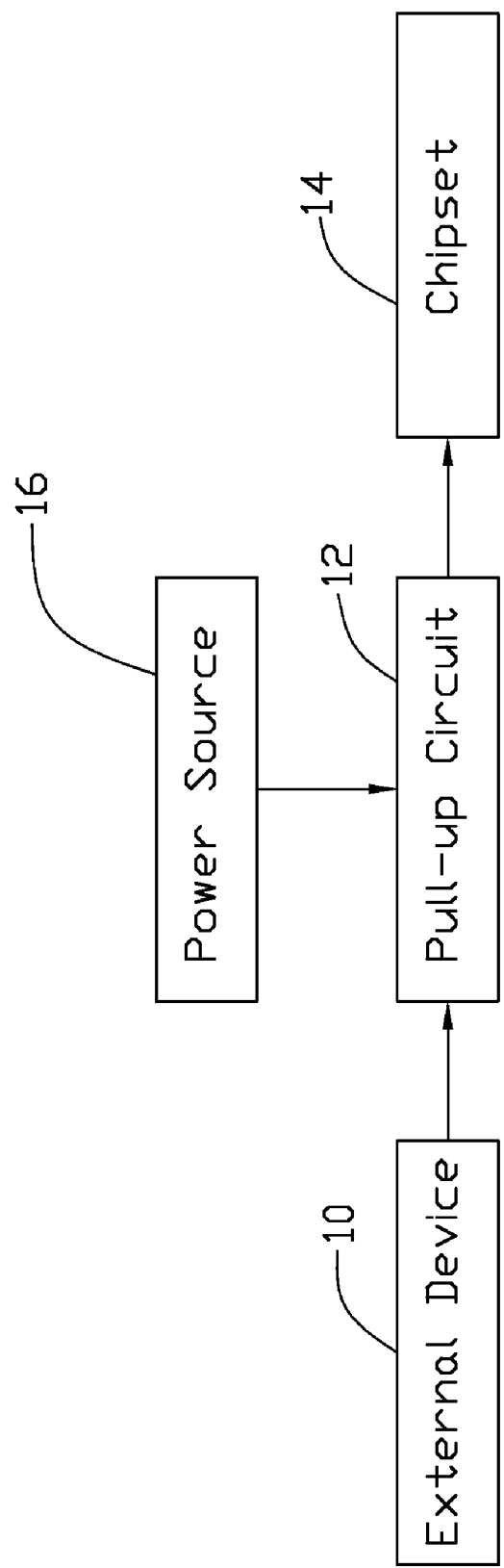
FIG. 1 is a block diagram of a typical pull-up circuit, applied between an external device and a chipset.
Figure 2:
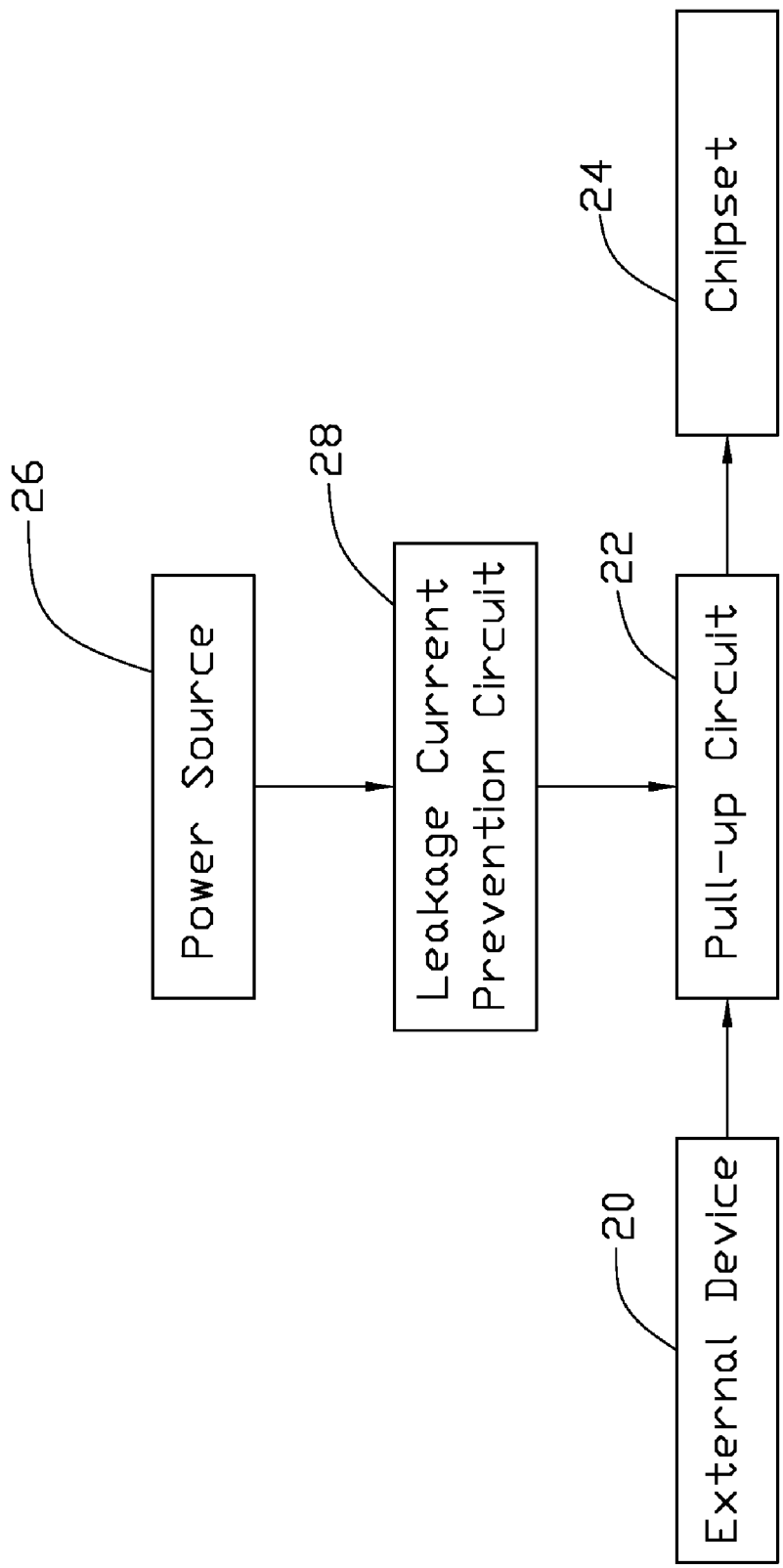
FIG. 2 is a block diagram of a pulled-up circuit, applied between an external device and a chipset, and having a leakage current prevention circuit in accordance with a preferred embodiment of the present invention.
Figure 3:
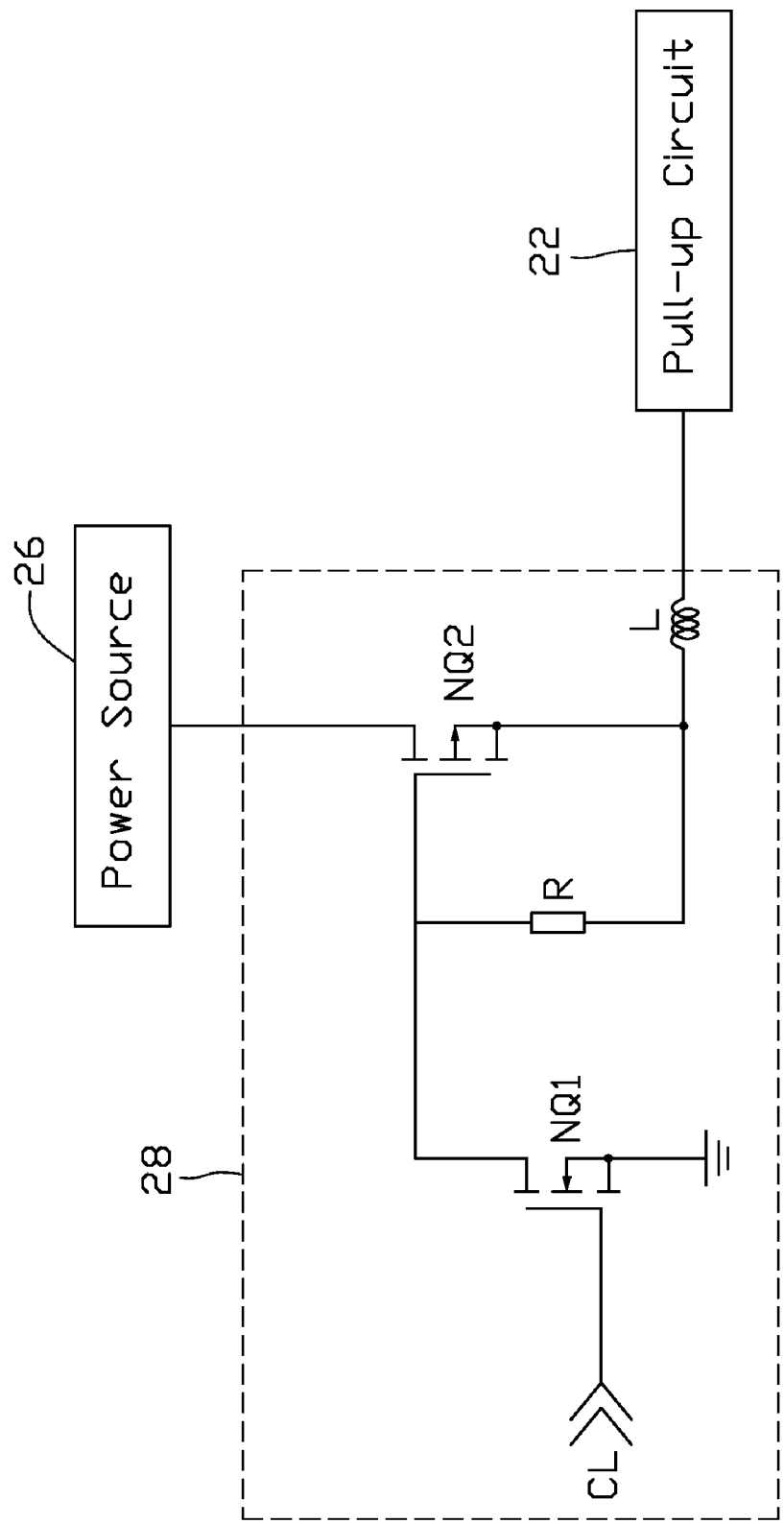
FIG. 3 is a detailed circuit diagram of the leakage current prevention circuit of FIG. 2, applied between a power source and a pull-up circuit.

Referring to FIGS. 2 and 3, a drive signal from an external device 20 for a pull-up circuit 22 is used to drive a chipset 24 of an electronic circuit. A power source 26 is adapted to provide voltage for the drive signal of the pull-up circuit 22 via a leakage current prevention circuit 28. The leakage current prevention circuit 28 in accordance with a preferred embodiment of the present invention includes a first transistor NQ1, and a second transistor NQ2. The second transistor NQ2 is electrically connected to the power source 26, which provides power. The first transistor NQ1 receives a control signal CL and controls on or off states of the second transistor NQ2. The control signal CL controls on or off states of the first transistor NQ1. The voltage is supplied to the pull-up circuit 22 when the second transistor NQ2 turns on to enhance driving ability of the drive signal. When the pull-up circuit 22 receives the drive signal, the control signal CL is high by program setting, and the control signal is low when the drive signal disappears.

In the preferred embodiment, the leakage current prevention circuit 28 further includes a resistor R and a filter inductor L. Both the first transistor NQ1 and the second transistor NQ2 are metal-oxide-semiconductor field-effect transistors (MOSFETs). The first transistor NQ1 is an N-channel MOSFET. The second transistor NQ2 is a P-channel MOSFET. A gate of the first transistor NQ1 receives the control signal CL. A source of the first transistor NQ1 is grounded. A drain of the first transistor NQ1 is connected to a gate of the second transistor NQ2. The gate of the second transistor NQ2 is also coupled to a source of the second transistor NQ2 via the resistor R. A drain of the second transistor NQ2 receives power from the power source 26. The source of the second transistor NQ2 outputs voltage to the pull-up circuit 22 via the filter inductor L. The drive signal of the pull-up circuit 22 receives the voltage to enhance driving ability of the drive signal. The filter inductor L is used for preventing leakage current from flowing to the power source 26 the instant of connecting the external device 20 to the pull-up circuit 22.

A working process of the leakage current prevention circuit 28 is as follows. The external device 20 is connected to the pull-up circuit 22 and provides a drive signal to the chipset 24. The gate of the first transistor NQ1 then receives a high level voltage control signal CL. Because the first transistor NQ1 is an N-channel MOSFET, the first transistor NQ1 is turned on, and a low level voltage is input to the gate of the second transistor NQ2. Because the second transistor NQ2 is a P-channel MOSFET, the second transistor NQ2 is turned on. Therefore, the power source 26 outputs voltage to the pull-up circuit 22 via the second transistor NQ2 and the filter inductor L. When the external device 20 is removed, the leakage current flows through the pull-up circuit 22. Because the control signal CL is low when the drive signal disappears, both the first transistor NQ1 and the second transistor NQ2 are turned off, preventing leakage current from flowing to the power source 26 from the pull-up circuit 22.

The first transistor NQ1, and the second transistor NQ2 of the preferred embodiment of the invention can be substituted with bipolar junction transistors or other electrical components to accomplish the same functions.

It is to be understood, however, that even though numerous characteristics and advantages of the preferred embodiments have been set forth in the foregoing description, together with details of the structures and functions of the embodiments, the disclosure is illustrative only, and changes may be made in detail, especially in matters of shape, size, equivalent material and arrangement of parts within the principles of the invention to the full extent indicated by the broad general meaning of the terms in which the appended claims are expressed.

What is claimed is:

1. A leakage current prevention circuit for preventing a power source from being affected by a leakage current which is generated at the instant of disconnecting an external device from the power source, the leakage current prevention circuit comprising:
a first transistor having a gate configured for receiving a control signal, a source grounded, and a drain; and
a second transistor having a gate connected to the drain of the first transistor, a drain electrically connected to the power source, and a source connected to a pull-up circuit and to the gate thereof via a resistor, wherein a drive signal generated by connecting the external device to the pull-up circuit is sent to a chipset, when the chipset receives the drive signal, the control signal controls status of the first and second transistors so that voltage from the power source is provided to the pull-up circuit for a pull-up voltage for the drive signal.

2. The leakage current prevention circuit as claimed in claim 1, wherein the first transistor is an N-channel metal-oxide-semiconductor field-effect transistor, the second transistor is a P-channel metal-oxide-semiconductor field-effect transistor.

3. The leakage current prevention circuit as claimed in claim 1, wherein the circuit further comprises a filter inductor connected between the second transistor and the pull-up circuit.

4. A circuit comprising:
a pull-up circuit configured to electrically connect a chipset with an external device which is configured for providing a drive signal to the chipset via the pull-up circuit;
a power source configured for providing voltage to the drive signal in the pull-up circuit to enhance driving ability of the drive signal; and
a control circuit connected between the pull-up circuit and the power source, the control circuit receiving a control signal corresponding to the drive signal, and being capable of controlling the power source selectively connecting with the pull-up circuit, wherein the control circuit comprises a first transistor with the gate thereof receiving the control signal, and the source thereof grounded, and a second transistor with the gate thereof connected to the drain of the first transistor, the drain connected to the power source, and the source connected to the pull-up circuit and to the gate thereof via a resistor.

5. The circuit as claimed in claim 4, wherein the first transistor is an N-channel-conductivity metal-oxide-semiconductor field-effect transistor, and the second transistor is a P-channel-conductivity metal-oxide-semiconductor field-effect transistor.

6. The circuit as claimed in claim 5, wherein the circuit further comprises a filter inductor connected between the source of the second transistor and the pull-up circuit.

7. A circuit comprising:
a pull-up circuit configured to electrically connect an electronic component with an external device which is configured for providing a drive signal to the electronic component via the pull-up circuit;
a power source configured for providing voltage to the drive signal in the pull-up circuit to enhance driving ability of the drive signal; and
a control circuit electrically connected between the pull-up circuit and the power source, the control circuit receiving a control signal in response to appearance and disappearance of the drive signal at the pull-up circuit and being capable of controlling the power source electrically connecting with the pull-up circuit or not according to the control signal, thereby preventing the power source being affected by a leakage current from the pull-up circuit, wherein the control circuit comprises a first transistor and a second transistor, the gate of the first transistor receives the control signal, the source of the first transistor is grounded, the gate of the second transistor is connected to the drain of the first transistor, the drain of the second transistor is electrically connected to the power source, the source of the second transistor is coupled to the pull-up circuit and to the gate thereof via a resistor.

8. The circuit as claimed in claim 7, wherein the circuit further comprises a filter inductor connected between the source of the second transistor and the pull-up circuit.

* * * * *